United States Patent [19]
Visser

[11] Patent Number: 6,059,938
[45] Date of Patent: May 9, 2000

[54] METHOD OF REDUCING PARTICLE CONTAMINATION DURING SPUTTERING

[75] Inventor: Jan Visser, Eindhoven, Netherlands

[73] Assignee: U.S. Philips Corporation, New York, N.Y.

[21] Appl. No.: 08/400,783

[22] Filed: Mar. 6, 1995

Related U.S. Application Data

[63] Continuation of application No. 08/125,355, Sep. 22, 1993, abandoned, which is a continuation of application No. 07/771,385, Oct. 2, 1991, abandoned.

[30] Foreign Application Priority Data

Oct. 8, 1990 [NL] Netherlands ............................ 9002176

[51] Int. Cl.$^7$ .................................................. C23C 14/34
[52] U.S. Cl. ................................ 204/192.12; 204/192.3; 204/298.06; 204/298.11
[58] Field of Search ......................... 204/192.12, 192.3, 204/192.33, 298.06, 298.11, 298.31, 298.34

[56] References Cited

U.S. PATENT DOCUMENTS

| | | | |
|---|---|---|---|
| 3,677,924 | 7/1972 | Cash et al. ...................... | 204/298.06 X |
| 3,699,034 | 10/1972 | Lins et al. ...................... | 204/298.06 X |
| 3,864,239 | 2/1975 | Fletcher et al. ..................... | 204/298.06 |
| 4,811,359 | 4/1989 | Jones et al. ......................... | 204/298.06 |
| 5,006,192 | 4/1991 | Deguchi .......................... | 204/298.06 X |

FOREIGN PATENT DOCUMENTS 0142568 7/1980 German Dem. Rep. ......... 204/298.06

OTHER PUBLICATIONS

A. Stern, "Reducing . . . Films", IBM Technical Dis. Bulletin, vol. 12, No. 1, Jun. 1969.

*Primary Examiner*—Rodney McDonald
*Attorney, Agent, or Firm*—Leroy Eason

[57] ABSTRACT

Method is described of reducing particle contamination during sputtering and sputtering device for the implementation of such a method.

A method of providing a layer on a substrate (1), whereby, during a certain process time, material (8) is detached from a target plate (6) through a bombardment of this target plate with ions from a gas discharge (4) under reduced pressure in a reactor chamber (2) which is provided with a support (7) for the substrate (1). Measures are taken to ensure that material deposited on a surface of chamber component (9) near the support (7) has a better adhesion. According to the invention, the measure for achieving a better adhesion of the material consists in that the surface of the chamber component (9) is first bombarded with ions from the gas discharge (4) for at least part of the process time. Material (8) detached from the target plate (6) and hitting the chamber component (9) will have a good adhesion thanks to the ion bombardment, so that no loose particles from the surface of the chamber component (9) can contaminate the layer on the substrate (1).

12 Claims, 1 Drawing Sheet

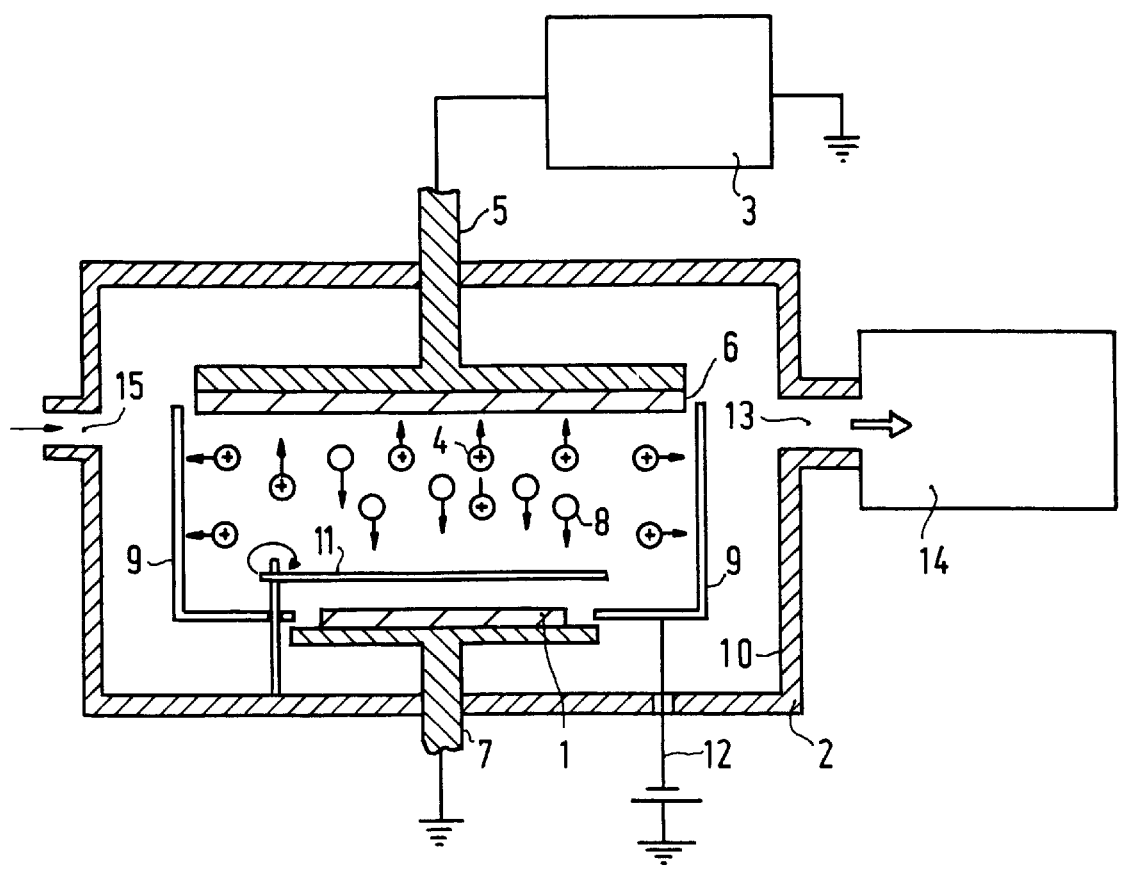

METHOD OF REDUCING PARTICLE CONTAMINATION DURING SPUTTERING

This is a continuation of application Ser. No. 08/125,355, filed on Sep. 22, 1993, which is a continuation of application Ser. No. 07/771,385, filed on Oct. 2, 1991, now both abandoned.

The invention relates to a method of providing a layer on a substrate, whereby during a certain process time material is detached from a target plate through a bombardment of this target plate with ions from a gas discharge under reduced pressure in a reactor chamber which is provided with a support for the substrate, while measures are taken to achieve a better adhesion of material which is deposited on a surface of a chamber component near the support. The invention also relates to a sputtering device for the implementation of such a method.

Such a method is particularly suitable for the manufacture of a semiconductor device, on which often metal layers are provided sputtered, which are given a pattern and function as conductors after the semiconductor device has been finished. Because of an ever increasing packing density of semiconductor devices (VLSI circuits), high quality requirements are set for such metal layers. During sputtering, it cannot be avoided that a portion of the sputtered material fails to reach the surface of the semiconductor slice and is deposited on a surface of a chamber component near the semiconductor slice, usually on a wall, screen, control electrode, or closure member. This material generally has a poor adhesion, so that there is a risk of this material becoming detached from the surface in the form of particles which may contaminate the slice. Such particles can interfere with the metal layer, so that the semiconductor device manufactured by the method does not function correctly. In general, therefore, measures have to be taken to prevent such contamination of the semiconductor slice.

BACKGROUND OF THE INVENTION

A method of the kind mentioned in the opening paragraph is known from the Japanese Patent Application no. 63-162861, whereby the surface of the chamber wall near the semiconductor slice is roughened in order to give material deposited there a better adhesion.

The known method described has the disadvantage that still too many particles reach the semiconductor substrate in practice. Another disadvantage is that the roughening of the chamber component leads to a surface area which is greater than in the case of a smooth chamber component. Such a greater surface area is capable of adsorbing and desorbing more impurities, so that the reduced pressure necessary for the sputtering process is less easy to achieve and maintain.

SUMMARY OF THE INVENTION

The invention has for its object inter alia to counteract the drawbacks mentioned.

The method according to the invention is for this purpose characterized in that the measure for giving the material a better adhesion consists in that the surface of the chamber component is bombarded with ions from the gas discharge for at least part of the process time.

It has been found that, if the chamber component near the support is bombarded with ions, material from the target plate ending up there has a very good adhesion. The adhesion turns out to be so good that no particles become detached from the chamber component. This is because the ions provide a strong adhesion owing to a so-called ion-plating process, whereby the ions penetrate the surface a few atom layers deep. The chamber component need not be roughened, so that no problem arises concerning achieving and maintaining the reduced pressure. In practice it is usually not necessary to bombard the surface of the chamber component with ions throughout the entire sputtering process. It suffices to bombard the surface of the chamber component with ions during some time after, for example, an interruption in the sputtering process, or after a temporary higher pressure in the reactor chamber, for example, during the exchange of the target plate. It is suspected that the surface becomes contaminated during such an interruption in the sputtering process, with the result that the material no longer adheres satisfactorily. A layer of material with good adhesion is fixed to the chamber component by the simultaneous bombardment with ions. This layer has a clean surface on which, after the bombardment has also stopped, material will have a good adhesion. The bombardment of the chamber component may take place without the semiconductor slice being present, provided that it is ensured that no contamination of the chamber component takes place after the bombardment.

Preferably, the method according to the invention is characterized in that the ion bombardment of the surface of the chamber component is achieved by giving this surface such a potential that the ions of the gas discharge are attracted to it. In this way it is very simple to send ions to the surface of the chamber component. The value of the potential is such that the ions penetrate the surface a few atom layers deep. A potential of 500 to 1000 V is usually sufficient for this.

Problems involving bad adhesion to the chamber component in the manufacture of semiconductor devices occur particularly when layers of tungsten or of a tungsten alloy are provided. The method accordingly is preferably characterized in that the material consists of tungsten or a tungsten alloy.

When the semiconductor slice is present and the surface of the chamber component is bombarded with ions, a portion of these ions may hit the semiconductor slice and cause radiation damage there. In addition, material may be sputtered off the chamber component and contaminate the semiconductor slice. Preferably, therefore, a substrate present in the support is screened off during the bombardment of the chamber component.

The invention further relates to a sputtering device for providing a layer on a substrate, comprising a reactor chamber with means for generating a gas discharge, a support for a target plate, and a support for the substrate. According to the invention, this device is characterized in that means are present for bombarding a surface of a chamber component near the support of the substrate with ions from the gas discharge. A semiconductor device can be manufactured with such a sputtering device. The surface of the chamber component can be bombarded with ions in this sputtering device at least during part of the process time. It is prevented in this way that detached material reaches the slice. The ions may be deflected in the direction of the chamber component by means of an electric or a magnetic field.

A further advantage is obtained when the means for bombarding the surface of the chamber component comprise an electrical connection for giving the surface of the chamber component such a potential that the ions from the gas discharge are attracted. With such an electrical connection, the surface of the chamber component may be easily given such a potential that the ions from the gas discharge are attracted and a layer with good adhesion is obtained.

A further advantage is obtained when a closure member is present in front of the substrate support, with which closure the substrate can be screened off. Such a closure member can be used as a screen for the semiconductor slice when the latter is present during the bombardment of the chamber component, so that radiation damage caused by ions hitting the slice during the bombardment of the surface of the chamber component near the semiconductor slice can be prevented.

BRIEF DESCRIPTION OF THE DRAWING FIGURE

The invention will be explained in more detail by way of example below, with reference to a drawing. In the drawing:

The drawing FIGURE shows a system for sputtering metal layers by the method according to the invention.

The FIGURE is purely diagrammatical and not drawn to scale.

DESCRIPTION OF THE INVENTION

The drawing FIGURE diagrammatically shows a device for providing a layer on a semiconductor substrate 1, comprising a reactor chamber 2 with means 3 for generating a gas discharge 4, a support 5 for a target plate 6, and a support 7 for the semiconductor substrate 1. The means 3 for generating the gas discharge 4 comprise, for example, a supply unit 3 which delivers the electric power required for the gas discharge 4. The target plate 6 acts as a first electrode and the semiconductor slice 1 as the second electrode for transferring the electric power of the supply unit 3. During a certain process time, material 8 is detached from the target plate in the reactor chamber 2 under reduced pressure by a bombardment of the target plate 6 with ions from the gas discharge 4, which material is then deposited on the semiconductor substrate 1. Such a device and such a method are particularly suitable for providing metal layers on semiconductor substrates, the metal layers acting as conductor patterns on semiconductor devices after etching and patterning. Part of the material 8, however, will also be deposited on components of the reactor chamber 2 near the semiconductor slice 1. Such a chamber component is, for example, a screen 9, which serves to prevent contamination of the reactor wall and sputtering-off of the rear of the holder 5 and the target plate 6, but it may also be formed by the wall 10 of the reactor chamber, by a closure member 11, by an auxiliary electrode (not shown), or some such item. It appears in practice that, for example, after opening of the reactor chamber 2, material 8 reaching the surface of the screen 9 has poor adhesion and that this material can become detached from the surface of the screen 9 in the form of particles and can thus contaminate the semiconductor slice 1. It is suspected that during opening of the reactor chamber the surface of the screen 9 is contaminated, so that the material 8 has poor adhesion. According to the invention, means are present in the device for bombarding the surface of the screen 9 with ions from the gas discharge 4. When the surface of the screen 9 is bombarded with ions from the gas discharge 4 for at least part of the process time, it is achieved that the material 8 will have very good adhesion thereon. After the bombardment of the screen 9, the surface of the screen will be provided with a clean, well-adhering layer. When the sputtering process is continued, material reaching this layer will also have good adhesion thereon, so that the generation of particles which can become detached and can reach the semiconductor slice is prevented. It is not necessary for good adhesion of material of the target plate on chamber components near the support of the semiconductor slice on which the semiconductor slice is present, provided of course, that no new contamination of the surface of the chamber components takes place during loading of the semiconductor slice, which can be achieved, for example, in that the semiconductor slice 1 is introduced through a load lock (not drawn). The means for bombarding the surface of the chamber component comprise, according to the invention, an electric connection 12 for giving the surface of the chamber component such a potential that the ions from the gas discharge 4 are attracted. Thus ions from the gas discharge 4 can be attracted toward the surface of the chamber component in a simple manner.

When a chamber component near the support 7 of the semiconductor slice 1 is subjected to an ion bombardment, while a semiconductor slice is present in the support, a portion of these ions can hit the semiconductor slice and cause radiation damage there. According to the invention, therefore, the device has a closure member 11 in front of the support 7 of the semiconductor slice 1, with which the semiconductor slice can be screened off. Thus a semiconductor slice 1 present in the support 7 is screened during the bombardment of the chamber component 9. Radiation damage is prevented in this way.

In practice, the reactor chamber 2 is kept at a reduced pressure through an output 13 by means of a vacuum pump 14. Argon gas is introduced into the reactor chamber, which has a pressure of approximately $5 \times 10^{-7}$ torr, through an inlet 15. The supply unit 3 provides an electric field between the target plate 6, which acts as a first electrode, and the semiconductor slice 1 of approximately 15 cm diameter, which acts as the second electrode. The gas is induced to form a gas discharge 4 through interaction with the electric field. The target plate 6 comprises the material 8 from which the layer on the semiconductor slice 1 is formed. This material 8 may contain inter alia metals such as platinum, titanium, titanium, or aluminium, but alternatively tungsten or a tungsten alloy may also be used.

During the sputtering process, the reactor chamber is evacuated to a pressure of $5 \times 10^{-7}$ torr, after which argon gas is introduced to achieve a pressure of $5 \times 10^{-3}$ torr. The support 5 and the target plate 6 are given a potential of −500 V (power 5 kW) by the supply unit 3, while the support 7 and the semiconductor slice 1 are at ground potential. The argon ions are attracted by the target plate 6 and will detach tungsten atoms 8 therefrom, which atoms are subsequently deposited on the semiconductor slice 1, but also partly on components of the reactor chamber near the semiconductor slice, such as the screen 9. After opening of the reactor chamber 2, for example, the tungsten will show poor adhesion to the screen 9. The poorly adhering tungsten may become detached from the surface of the screen 9 in the form of particles and thus contaminate the semiconductor slice 1. According to the invention, therefore, the screen 9 is given a potential of −1000 V for a short period, for example approximately 1 minute, after a possible contamination of the surface of this screen, in order to attract argon ions from the gas discharge 4 towards the screen 9. The semiconductor slice 1 is preferably not present during this. The argon ions ensure a very good adhesion of the tungsten 8 to the screen 9, so that the generation of loose tungsten particles capable of contaminating the semiconductor slice 1 is prevented. After this, preliminary sputtering takes place for approximately 1 minute in that the target plate is set at −500 V (power 5 kW), during which the closure member 11 and the support 7 for the semiconductor slice 1 are at ground potential. Then the gas discharge is switched off and the semiconductor slice 1 is introduced into the reactor chamber through a so-called load lock without interruption of the vacuum and positioned on the support. The semiconductor slice 1 is screened off by the closure member 11 and preliminary sputtering takes place for 1 to 2 seconds. After preliminary sputtering, the closure member 11 is turned away, upon which a 100 nm thick tungsten layer is provided on the slice 1 during, for example, 1 minute. This tungsten layer may then be patterned by means of usual etching techniques, so that the layer can be used, for example, as a conductor layer in a semiconductor device.

A metal layer which is not contaminated by particles issuing from chamber components is obtained by the method described above.

The invention is described above for the provision of a layer on a semiconductor substrate. The invention is particularly suitable for this, but it is not limited to such substrates. The method and the device are also useful when other substrates are to be provided with layers which must meet high quality requirements. Examples are the provision of metal layers on glass, such as during the manufacture of liquid crystal display television screens (LC-TV).

What is claimed is:

1. A method of providing a layer of a material on a substrate, comprising the steps of:
    (a) during a given process time subjecting a target electrode plate to ionic bombardment from a discharge of gas flowing past said target plate, thereby detaching material from said target plate;
    (b) during at least a portion of said process time also subjecting surfaces of chamber components near a substrate support to ionic bombardment from said gas discharge, the gas discharge being at reduced pressure in a reactor chamber containing said target electrode, said chamber components and said substrate support, so that material detached from the target electrode is deposited on the surfaces of said chamber components during ionic bombardment thereof and thereby forms an ion plated layer of said material on said surfaces; and
    (c) still during said process time but following formation of said ion plated layer on said surfaces, depositing a layer of detached material from the target electrode on a substrate on said substrate support in said chamber, contamination of said substrate by detachment of material from the surfaces of said chamber components being substantially avoided as a result of improved adhesion of material deposited on said surfaces following formation of said ion plated layer thereon.

2. A method according to claim 1, wherein said step of depositing a layer of material on said substrate is carried out by applying a negative potential of sufficient strength to said target electrode plate and maintaining said substrate support and said substrate at ground potential.

3. A method according to claim 2, wherein said step of depositing said layer is carried out by reducing pressure in said reactor chamber to about $5\times10^{-7}$ torr and introducing argon gas until a pressure of $5\times10^{-3}$ torr is achieved.

4. A method according to claim 2, wherein said negative potential has a strength of about −500 volts.

5. A method according to claim 1, wherein said substrate is placed onto said substrate support after said step (b) of depositing said material onto said surfaces of said chamber of components.

6. A method according to claim 1, wherein a negative potential is applied to said chamber components of sufficient strength to attract ions from said gas discharge to the surfaces of said components.

7. A method according to claim 6, wherein said negative potential is −1000 volts applied for about 1 minute.

8. A method according to claim 1, wherein a closure screen is placed between said substrate support and substrate and said target electrode plate to protect said substrate from radiation damage during said step (b).

9. A method according to claim 8, wherein a negative potential is applied to said chamber components of sufficient strength to attract ions from said gas discharge to the surfaces of said components.

10. A method according to claim 9, wherein said negative potential is −1000 volts applied for about 1 minute.

11. A method according to claim 1, wherein said material consists of tungsten for a tungsten alloy.

12. A method according to claim 1, wherein said ionic bombardment of the surfaces of chamber components is accomplished by establishing an electrical potential of said surfaces sufficient to ion plate material detached from said target electrode plate to said surfaces.

* * * * *